United States Patent [19]

Johnson et al.

[11] Patent Number: 4,520,449

[45] Date of Patent: May 28, 1985

[54] PHASE ANGLE DETECTOR

[75] Inventors: Edwin A. Johnson, Clarkston; Chun K. Leung, Bloomfield Hills, both of Mich.

[73] Assignee: Allied Corporation

[21] Appl. No.: 399,538

[22] Filed: Jul. 19, 1982

[51] Int. Cl.³ .................... G06F 15/20; G01R 25/00
[52] U.S. Cl. .................... 364/559; 328/133; 364/431.08
[58] Field of Search .......... 364/431.08, 559; 328/133

[56] References Cited

U.S. PATENT DOCUMENTS

| | | | |
|---|---|---|---|
| 4,197,767 | 4/1980 | Leung | 74/80 |
| 4,307,346 | 12/1981 | Kurosawa et al. | 328/133 X |
| 4,337,435 | 6/1982 | Munoz | 328/133 |
| 4,357,662 | 11/1982 | Schira et al. | 364/431.08 |
| 4,360,889 | 11/1982 | Liedtke | 328/133 X |
| 4,400,664 | 8/1983 | Moore | 328/133 X |

Primary Examiner—Felix D. Gruber
Attorney, Agent, or Firm—James R. Ignatowski; Russel C. Wells

[57] ABSTRACT

A phase angle detector for computing the phase angle of the individual impulses imparted to the crankshaft of an internal combustion engine having means for computing the sin and cos functions of each torque impulse in response to the instantaneous rotational velocity of the engine's crankshaft, means for detecting a change in the rotational velocity of the engine's crankshaft at the beginning and end of each torque impulse, means for correcting the value of the generated sin function as a function of the difference the crankshaft's rotational velocity at the beginning and end of the torque impulse, and means for computing the phase angle of the torque impulse from the cos and corrected sin functions.

9 Claims, 5 Drawing Figures

PHASE ANGLE DETECTOR

CROSS REFERENCE

The disclosed invention is related to commonly assigned co-pending patent application Ser. No. 187,400 "Closed Loop Timing and Fuel Distribution Controls" filed Sept. 15, 1980 now U.S. Pat. No. 4,357,662 which is a continuation of patent application Ser. No. 904,131 filed May 8, 1978 now abandoned.

FIELD OF THE INVENTION

The invention is related to the field of internal combustion engine fuel controls and in particular to method for computing the phase angle of the torque impulses imparted to the engine's output shaft in response to the combustion process in each of the engine's cylinders.

PRIOR ART

Electronic ignition and fuel control system for internal combustion engines are finding acceptance in the automotive and allied industries as a result of the substantial increases of fuel costs and pollution standards imposed by the government.

R. W. Randall and J. D. Powell of Stanford University in their research under a Department of Transportation sponsored project determined that for maximum efficiency of an internal combustion engine, the spark timing should be adjusted to provide a maximum cylinder pressure at a predetermined crankshaft angle past the piston's top dead center position. The results of this investigation are published in a Final Report NO. SUDAAR-503 entitled "Closed Loop Control of Internal Combustion Engine Efficiency and Exhaust Emission". This report contains a block diagram of a closed loop system incorporating a circuit which detects the angle at which peak pressure occurs then compares this angle with the predetermined angle to generate an error signal. This error signal is then used to correct the ignition timing signal generated in response to other sensed engine parameters, such as engine speed and intake manifold pressure.

C. K. Leung and R. W. Seitz in commonly assigned co-pending patent application, Ser. No. 187,400 filed Sept. 15, 1980, disclose an alternate closed loop engine timing and fuel distribution control which computes the phase angle of the torque impulse applied to the engines output shaft. The computed phase angle of the torque impulse is then compared with a desired phase angle of the torque impulse to generate an error signal. This error signal is then used to correct the ignition or injection timing signals generated in response to other engine parameters. The method for calculating the phase of the torque impulse disclosed in patent application Ser. No. 187,400 is based on the theory that the period of each torque impulse is approximately the same such that the engine speed at the beginning and end of each torque impulse does not change. In actuality, this assumption is not true, even during steady state operation and the fluctuation of the engine speed as a result of torque impulses of different magnitudes introduces errors into the computed phase angle. To remove these errors, the prior art teaches averaging the computed phase angles of the torque impulses. This approach is satisfactory where the ignition and/or injection timing signals are to be corrected alike, however, it is not satisfactory in an engine control system which seeks to optimize the torque impulse of each of the engine cylinders on an individual basis.

Disclosed herein is a method and corresponding circuit for removing the errors introduced into the computation of the phase angle of each torque impulse.

SUMMARY OF THE INVENTION

The invention is a method and apparatus for generating the phase angle of a torque impulse imparted to the crankshaft from the pistons of an internal combustion engine corrected to compensate for a change in difference in the engine speed at the beginning of the impulse cycle and at the end of the impulse cycle. The invention comprises detecting the difference in engine speed at the beginning and end of each torque impulse to generate a correction factor which is a function of this difference. Dividing each torque impulse into at least 4 equal angular intervals of crank shaft rotation and measuring the period for each angular interval. Generating from the periods of said angular intervals the Fourier sine and cosine functions of the torque impulse. Adding the generated correction factor to the sine function to generate a corrected sine function, then dividing the corrected sin function by the cos function to generate the tangent function of the torque impulse. Finally, addressing an arctan or anti tangent look up table with the generated tangent function to output the angle corresponding to phase angle of the torque impulse.

The advantage of the invention is that it provides for a more accurate computation of the phase angle for the torque impulses when the engine's speed is changing. Another advantage of the invention is that the correction diminishes towards zero when the engine speed is constant. These and other advantages will become apparent from reading the Specification in conjunction with the drawings.

DETAILED DESCRIPTION OF THE INVENTION

Figure 1:
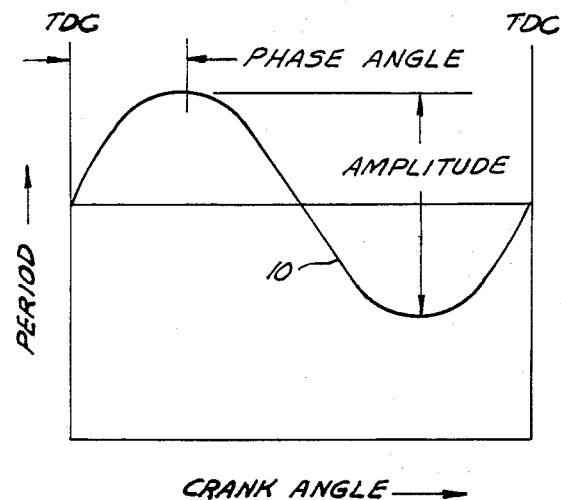
FIG. 1 is a graph showing the change in the period of a torque impulse as a function of crankshaft rotation at a constant engine speed.

The properties of a period wave 10 of an engine's flywheel as a function of crank angle is illustrated in FIG. 1. Each period wave is a result of a torque impulse imparted to the engine's crankshaft by the combustion of the fuel in the individual cylinders of the engine. Each period wave is measured for a predetermined angular rotation of the crankshaft and is measured from a predetermined position, such as the angular position of the crankshaft when the associated piston is in a particular place in the cylinder. A commonly used reference point is the "top dead center" (TDC) position of the piston. However, the reference point may be any other desired position of the piston. Referring now to FIG. 1, the phase angle $\emptyset$ is an angular displacement of the sinusoidal period wave imparted to the engine's crankshaft by a torque impulse from the reference point.

From the teachings of Randall and Powell, the best operating condition for a given engine is to have the peak cylinder pressure occur at a certain angular rotation of the crankshaft past the top dead center position. Therefore, the sinusoidal period wave 10, which is generated by the combustion of fuel is indicative of the angle past the top dead center position at which peak cylinder pressure occured. This is done by using the phase angle of the period wave as described hereinafter. The phase angle $\phi$ therefore is the difference in degrees of crankshaft rotation $\theta$ between the reference point and the maixmum amplitude of the sinusoidal period wave which corresponds to the minimum rotational velocity of the engine's crankshaft. If the phase angle of the sinusoidal period wave is different from the desire phase $\phi$, the crankshaft will have its minimum rotational velocity at a different angular position of the crankshaft. The primary causes in a change in the phase angle of the period wave are the ignition timing in a spark ignited engine or injection timing in a diesel engine. Manufacturing variations in the engine or different compression ratios from cylinder to cylinder can also cause changes in the phase angle of the period wave.

As previously described in patent application Ser. No. 187,400 the functions $A \sin \phi$ and $A \cos \phi$ can be obtained by dividing the period wave into four equal angular intervals of the engine's crankshaft, $P_1$ through $P_4$ as follows:

$$P_1 = \sum_{i=0}^{(N/4)-1} f(\theta_i)$$

$$P_2 = \sum_{i=N/4}^{(N/2)-1} f(\theta_i)$$

$$P_3 = \sum_{i=N/2}^{(3N/4)-1} f(\theta_i)$$

$$P_4 = \sum_{i=3N/4}^{N-1} f(\theta_i)$$

where N is the number of sampling periods between the top-dead-center position of successive cylinders and $f(\theta)$ is the elapsed time of the individual sampling periods.

Then $$A \sin \phi \approx [(P_1 - P_3) + (P_2 - P_4)]$$

$$A \cos \phi \approx [(P_1 - P_3) - (P_2 - P_4)]$$

and the phase angle $\phi$ equals:

$$\phi = \arctan\left[\frac{A \sin \phi}{A \cos \phi}\right]$$

and the amplitude A equals:

$$A = \sqrt{(A \sin \phi)^2 + (A \cos \phi)^2}$$

As indicated, the above computation method provides the proper result if the beginning and ending period of the period wave are the same. If the beginning and ending periods are not the same, the above computation does not provide the proper phase angle or amplitude.

In order to obtain the true phase angle and amplitude of the period wave when the period at the beginning and ending of the period wave are different, a correction to the equations described above is needed. Assuming the period wave 10 has the shape shown in FIG. 2. The period difference between the first and last period of each period wave is defined by x where:

$$x = f(\theta_{n-1}) - f(\theta_0)$$

where $f(\theta_0)$ is the period at the beginning of the first period wave and $f(\theta_{N-1})$ is the period at the end of the same period wave.

Figure 2:
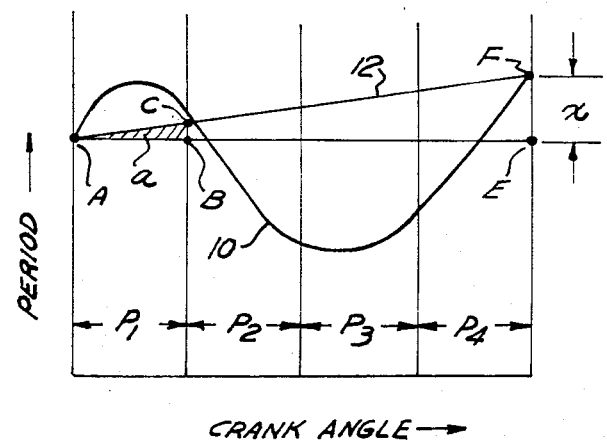
FIG. 2 is a graph showing the change in the period of a torque impulse as a crankshaft rotation for a changing engine speed.

In order to correct the period wave so that the first period and last period are the same, the following correction is required. Referring to FIG. 2, the period wave is divided into four equal intervals of crank angle as before. The point A represents the starting value of the period wave and point F represents the ending value of period wave. The point E represents where the wave should have ended for the previously defined equations to be accurate and x is the difference between E and F. If we want to rotate the reference line 12 from $\overline{AF}$ to $\overline{AE}$ then the values of $P_1$, $P_2$, $P_3$ and P have to be corrected.

The corrected value of $P_1$ is defined as $CP_1$ and is corrected as follows:

$$CP_1 = P_1 - a$$

wherein a = the area of the triangle ABC therefore:

$$a = 1/2 \, (\overline{AB} \cdot \overline{BC})$$

or $$a = 1/2 \, (N/4)(x/4)$$

where $\overline{AB} = \frac{N}{4}$ $$\overline{BC} = \frac{x}{4}$$

Then it follows that:

$$CP_2 = P_2 - 3a$$

$$CP_3 = P_3 - 5a$$

$$CP_4 = P_3 - 7a$$

Then:

$$A \sin \phi \approx [(CP_1 - CP_3) + (CP_2 - CP_4)]$$

or $$A \sin \phi \approx (P_1 - P_3) + (P_2 - P_4) + 8a]$$

or $$A \sin \phi \approx (P_1 - P_3) + (P_2 - P_4) + x(N/4)]$$

and $$A \cos \phi \approx [(CP_1 - CP_3) - (CP_2 - CP_4)]$$

or $$A \cos \phi \approx [(P_1 - P_3) - (P_2 - P_4)]$$

The phase angle ∅ and amplitude A are determined as follows:

$$\phi = \arctan\left[\frac{A\sin\phi}{A\cos\phi}\right]$$

Figure 3:
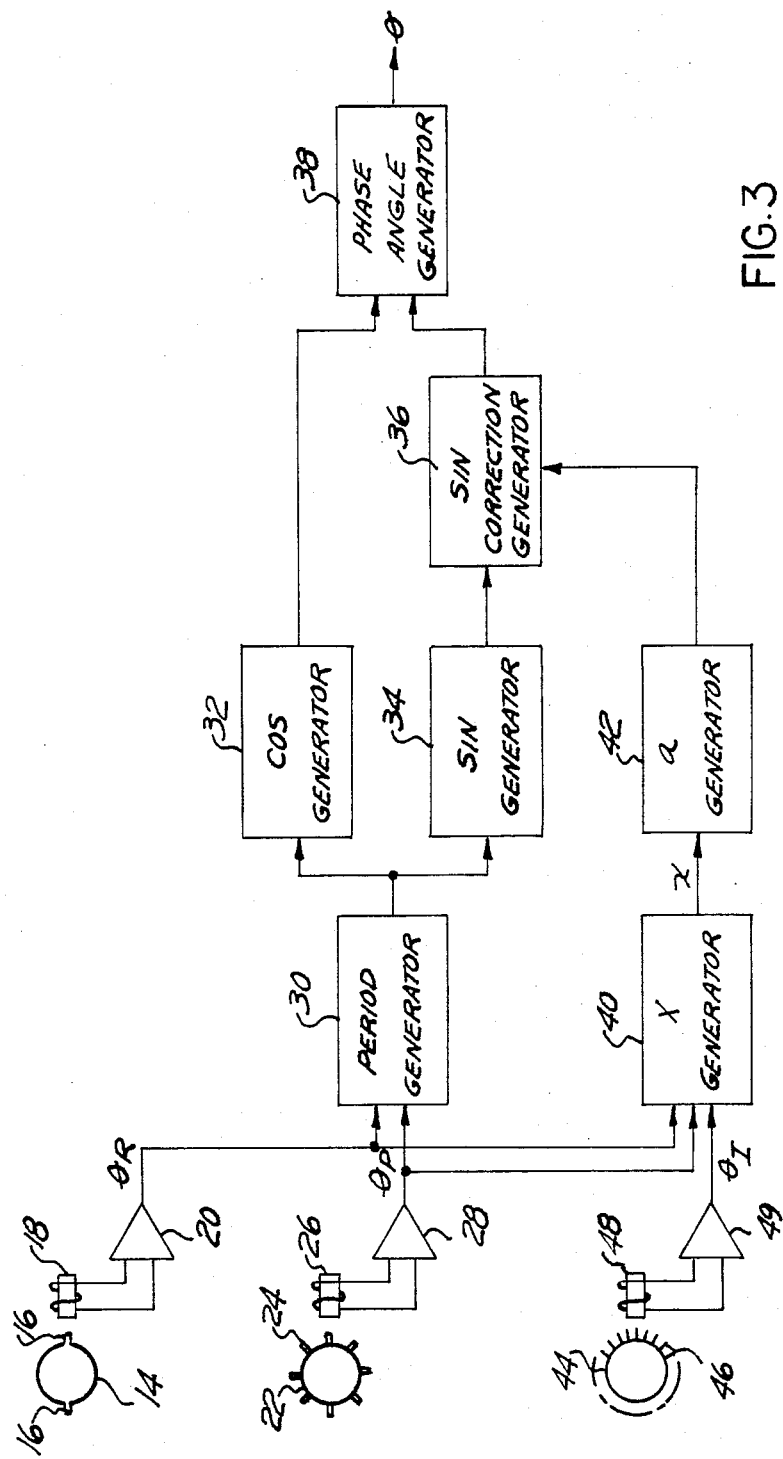
FIG. 3 is a block diagram of the invention.

An implementation for correcting the phase angle ∅ in accordance with the above derivation of a 4 cylinder engine is illustrated in block form of FIG. 3. Referring to FIG. 3, a reference signal $\theta r$ is derived from a pair of diametrically disposed markers on the engine's crankshaft or a wheel, such as wheel 14 attached to the engine's crankshaft. Wheel 14 has a pair of diametrically disposed teeth 16 the passing of which past a fixed reference point may be detected optically, electrically or magnetically. A fixed sensor, such as a magnetic transducer 18 detects the passing of teeth 16 and generates reference signals which are amplified by operational amplifier 20 to generate the reference signal $\theta_R$.

The teeth 16 have a predetermined rotational position with respect to the position of the engine's pistons. This may be the top-dead-center position of the pistons or may be any other predetemined position. As the engine's crankshaft rotates through 2 complete revolutions, indicative of a full engine cycle, the sensor 18 will generate a reference signal for each piston as it assumes the predetermined position. The reference signals $\theta_R$ are received by both a Period Generator 30 and an x Generator 40.

In a similar manner, wheel 22 has eight (8) teeth 24 equally spaced about its periphery dividing a full cycle of the engine into 16 equal angular intervals, four (4) for each piston. Each tooth 24, as it passes a sensor, such as magnetic sensor 26 generates a period reference signal which is amplified by an operational amplifier 28 to produce the period reference signal $\theta_P$. The period reference signals $\theta_P$ are also received by the Period Generator 30 and the x Generator 40.

Likewise, a wheel 44 attached to the engine's crankshaft, such as the ring gear, has a plurality of teeth 46. A sensor, such as magnetic sensor 48 detects the passing of each tooth 46 and generates an increment reference signal which is amplified by operational amplified 49 to generate the increment reference signals $\theta_I$. The increment reference signals $\theta_I$ are received by the x Generator 40.

The x Generator 40 detects the length of the first incremental period, after the occurrence of first period reference signal $\theta_P$ following each reference signal $\theta_R$ and computes the value "x" from the differences between the lengths of successive incremental periods. This is the value x which is the difference between the beginning and end values of the period wave 10 as discussed with reference to FIG. 2.

An "a" Generator 42 receives the value of x from the x Generator 40 and generates the correction factor "8a" in accordance with the equation:

$$8a = kx$$

where a is the area of the triangle ABC discussed with reference to FIG. 2 and k is a constant having the value N/4. The correction factor is tranmitted to the Sin Correction Generator 36.

The period Generator 30 measures the durations of the four periods $P_1$, $P_2$, $P_3$ and $P_4$ in response to the period reference signals $\theta_P$ and the reference signal $\theta_R$. the durations of the four periods $P_1$, $P_2$, $P_3$ and $P_4$ are transmitted to the COS Generator 32 and SIN Generator 34 where they are converted to the respective values:

$$A\cos\emptyset \approx [(P_1-P_3)-(P_2-P_4)]$$

and $$A\sin\emptyset \approx [(P_1-P_3)+(P_2-P_4)]$$

where A is the amplitude of the Fourier component of the period wave,

∅ is the relative phase angle of the Fourier component of the period wave, and N is the number of samples.

The value of A sin ∅ is transmitted to the SIN Correction Generator 36 where it is added to the correction factor x(N/4) to generate a corrected value A sin ∅ having a value:

$$A\sin\emptyset \approx [(P_1-P_3)+(P_2-P_4)+x(N/4)]$$

The values of A cos ∅ and the corrected value of A sin ∅ are received by the Phase Angle Generator 38 which computes the phase angle ∅ of the period wave in accordance with the equation:

$$\emptyset = \text{arc tan } \emptyset$$

where tan ∅ = A sin ∅/A cos ∅.

Figure 4:
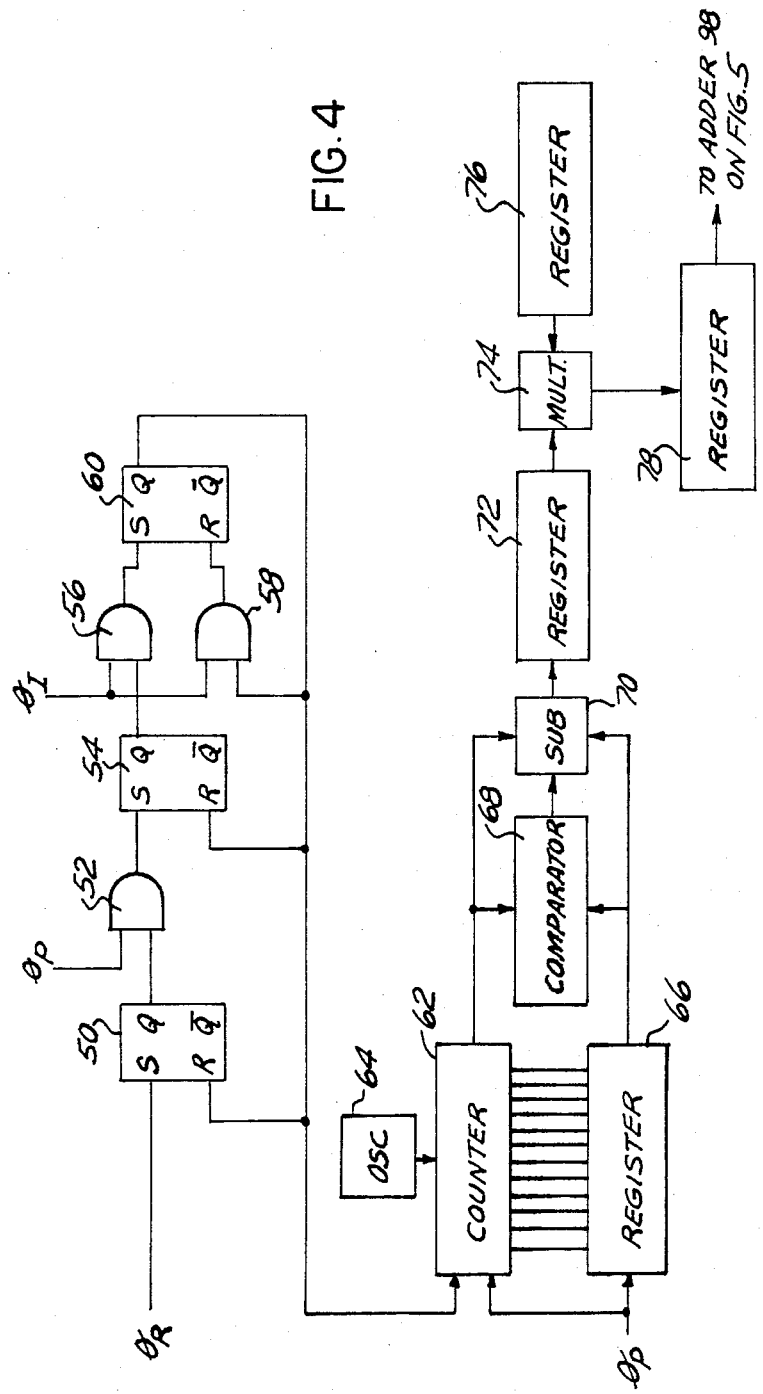
FIG. 4 is a diagram of the circuit for generating the correction factor.
Figure 5:
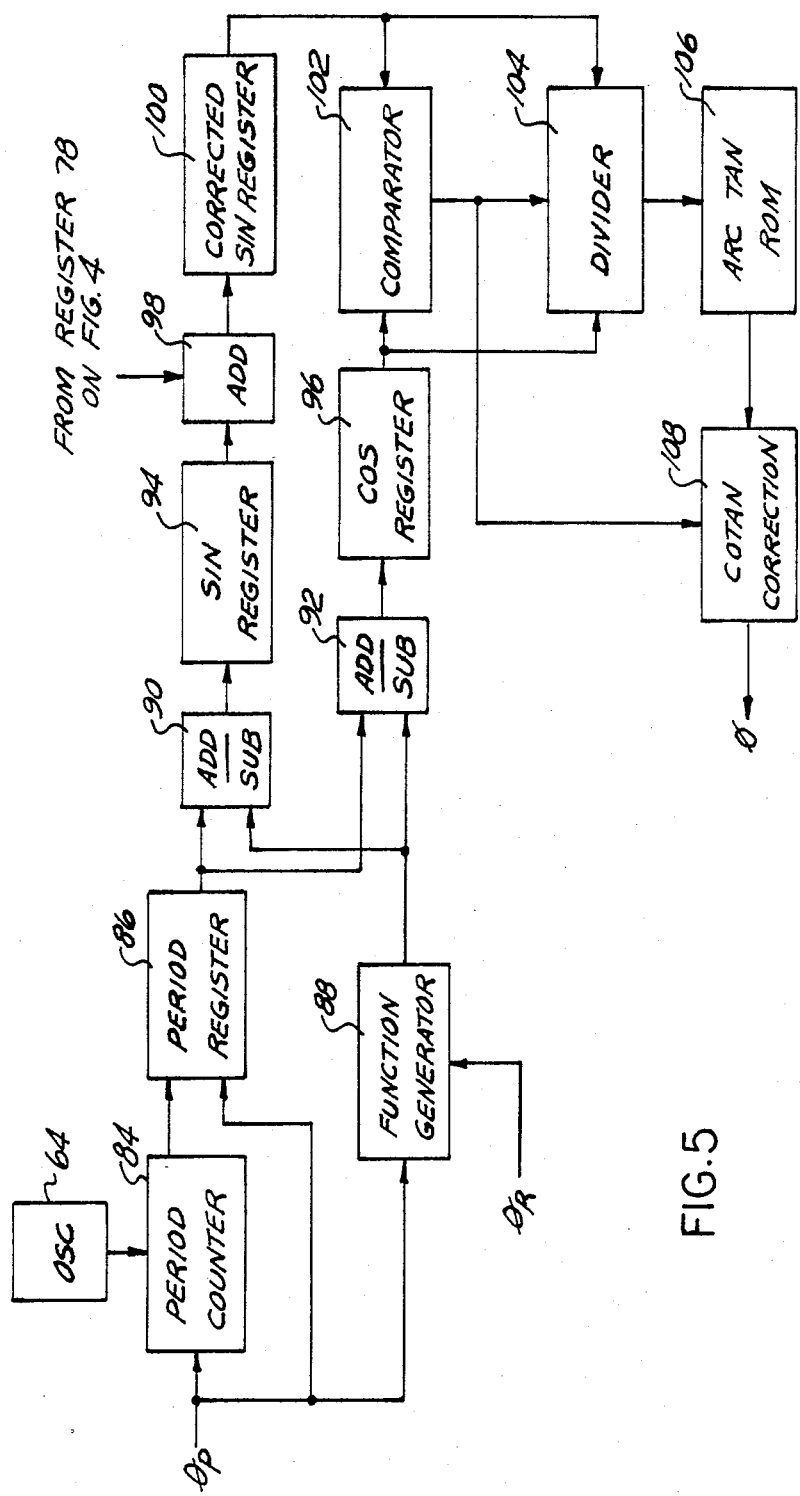
FIG. 5 is a diagram of the circuit for generating the corrected phase angle of the torque impulse.

The phase angle ∅ is preferably generated from the given input by an appropriately programmed computer, such as a commerically available microprocessor, or by a special purpose hardwired circuits as shown in FIGS. 4 and 5.

Referring now to FIG. 4 there is shown a circuit for generating the correction factor used in the correction the phase angle ∅. In this embodiment the signals $\theta_R$, $\theta_P$ and $\theta_I$ are the same as discussed with reference to FIG. 3 and are assumed to be generated in a sequential order. It is recognized that if $\theta_R$ and $\theta_P$ can be made to occur simultaneously, or if all three can be made to occur simultaneously, the first part of this circuit can be simplified. The signal $\theta_R$ is received at the set input(s) of a Flip Flop 50 have its Q output connected to AND Gate 52. The signal $\theta_P$ is received at the other input of AND Gate 52. The output of AND Gate 52 is received at the set input of a second Flip Flop 54 having its Q output connected to one input of AND Gate 56. The signal $\theta_I$ is connected to the other input to AND Gate 56 and to one input of AND Gate 58. The outputs of AND Gates 56 and 58 are respectively connected to the set input(s) and reset input (r) of a Flip Flop 60. The Q output of Flip Flop 60 is connected to the other input to AND Gate 58, the reset inputs to Flip Flop 50 and 54 and the enable input of Counter 62. The Counter 62 receives the output of an Oscillator 64 at its count input. A Register 66 is connected in parallel with Counter 62 and is enabled by the $\theta_P$ signal $\theta_P$ the outputs of Counter 62 and Register 66 are connected to a comparator 68 and a Subtract Circuit 70. The output of the Subtract Circuit 70 is connected to an x Register 72 having its output connected to one input of a Multiplier Circuit 74. A Register 76 stores the constant N/4 and has its output connected to the other input of the Multiplier Circuit 74. The output of the Multiplier Circuit 74 is connected to the input of Register 78 which stores the product of Registers 72 and 76.

The operation of the circuit is as follows:

The reference signal $\theta_R$ sets Flip Flop 50 and its Q output enables AND Gate 52. The first period reference signal $\theta_P$ is passed by enabled AND Gate 52 and sets Flip Flop 54. The Q output of Flip Flop 54 enables AND Gate 56 so that the next interval reference signal $\theta_I$ sets Flip Flop 60. The Q output of Flip Flop 60 enables AND Gate 58, resets Flip Flops 50 and 54 and enables Counter 62. Resetting Flip Flop 54 disables AND Gate 56, therefore, the next sequential increment reference signal $\theta_I$ will reset Flip Flop 60 through enabled AND Gate 58. Also the resetting of Flip Flop 50 disables AND Gate 52 so that Flip Flop 54 cannot be reset by the subsequent phase reference signals $\theta_P$ until the next occurrance of a reference signal $\theta_R$.

Counter 62 during the enabled period stores the number of pulses received from the Oscillator 64. The number of stored pulses being indicative of the length of time between the first and second increment reference signals $\theta_I$. The number of pulses stored in Counter 62 is compared in Comparator 68 with the number of pulses stored in Register 66 from the previous period wave which had been transferred from Counter 62 to Counter 66 in response to the reference signal $\theta_R$. Comparator 68 determines which register has the lesser number of stored pulses and enables the Subtract Circuit 70 to subtract the content of the register containing the lesser number of stored pulses from the register having the greater number of stored pulses. The difference in the number of stored pulses is the difference x discussed with reference to FIG. 2. This difference is stored in x Register 72. The content of x Register 72 is then multiplied, in Multiplier Circuit 74, with the constant (N/4) stored in Register 76 to generate the desired correction value x(N/4). The output of the Multiplier Circuit 74 is stored in Register 78. The content of Register 78 is subsequently used to correct the value of A sin $\emptyset$ function as descibed with reference to FIG. 3.

Referring now to FIG. 5 there is shown a circuit for generating the corrected phase angle $\emptyset$. The period reference signal $\theta_P$ is received at the enable input of a Period Counter 84 which counts the pulses received from an oscillator 64 between sequential period reference signals $\theta_P$, a Period Register 86 and a Function Generator 88. The Oscillator 64 may be the same as Oscillator 64 discussed with reference to FIG. 4. The output of the Period Counter 84 is connected to the input of Period Register 86 which has its output connected to ADD/SUBSTRATE Circuits 90 and 92. The Function Generator 88 also receives the reference signal $\theta_R$ and has its output also connected to inputs of ADD/SUBTRACT Circuits 90 and 92.

The output of ADD/SUBTRACT Circuit 90 is connected to the input of SIN Register 94 while the output of ADD/SUBTRACT Circuit 92 is connected to the input of COS Register 96.

The output of SIN Register 94 is connected to one input of an Adder 98 which receives the correction value x(N/4) at its other input. The output of Adder 98 is connected to the input of corrected SIN Register 100.

The outputs of COS Register 96 and Corrected SIN Register 100 are received at the inputs of a Comparator 102 and Divider 104. The output of Comparator 102 is also received by Divider 104 and a COTAN correction Circuit 108. The output of the Divider 104 is connected to the input of an ARCTAN Read Only Memory 106.

The output of the ARCTAN Read Only Memory 106 is also connected to the COTAN Correction Circuit 108. The content of the COTAN Correction Circuit 108 is the desired phase angle $\emptyset$.

The operation of the circuit is as follows:

The Period Counter 84 counts the number of pulses generated by the Oscillator 64 between successive period reference signals $\theta_P$. At the end of each period, the Period Register 86 is enabled by the period reference signal to store the number of pulses counted by the Period Counter 84 during the preceeding period. The content of the Period Register 86 are transferred to the SIN Register 94 and COS Register 96 through ADD/SUBTRACT Circuits 90 and 92 respectively under the control of the signals generated by the Function Generator 88. The details of the Function Generator 88 are fully described in U.S. Pat. No. 4,357,662 issued November 2, 1982. Briefly, the Function Generator 88 generates signals enabling ADD/SUBTRACT Circuits 90 and 92 to either add or subtract the content from the Period Register 86 to or from the content of SIN Register 94 and COS Register 96 in a predetermined sequence in response to the reference signal $\theta_R$ and period reference signal $\theta_P$. At the end of the fourth period following the reference signal $\theta_R$, the content of the SIN Register 94 is $(P_1-P_3)+(P_2-P_4)$ where $P_1$, $P_2$, $P_3$ and $P_4$ are the content of the Period Register 86 for the four sequential periods following the reference signal $\theta_R$. Likewise, at the end of the fourth period, the content of the COS Register 96 is $(P_1-P_3)-(P_2-P_4)$. The correction factor x(N/4) is then added to the content of SIN Register 94 in Adder 98 and the corrected value stored in the Corrected SIN Register 100.

The content of Corrected SIN Register 100 is then compared with the content of COS Register 96 in Comparator 102 to generate a signal indicating which of the two is smaller. The Divider 104 in response to the signal generated by Comparator 102 divides the content of the Corrected SIN Register 100 or COS Register 96, whichever is smaller by the content of the register storing the larger value. The output of Divider 104 is then used to address the ARCTAN Read Only Memory 106 storing the corresponding value of the phase angle $\emptyset=\arctan$ (A sin $\emptyset$ / A cos $\emptyset$). When the content of the COS Register 96 is divided by the content of the Corrected COS Register 100, the output of the ARCTAN Read Only Memory 106 is corrected in the COTAN Correction Circuit 108 where the phase angle $\emptyset = \pi/2 - \arctan$ (A cos $\emptyset$ / A sin $\emptyset$). This conversion in the COTAN Correction Circuit 108 is enabled by the output of Comparator 102 signifying the content of COS Register 96 was divided by the content of Corrected SIN Register 100.

As previously indicated, when the engine speed at the end of a torque impulse is different from the speed at the beginning of the torque impulse, the use of the corrected function A sin $\emptyset$ results in a more accurate computation of the torque impulse's phase angle. This correction will automatically be made when the average engine speed is changing such as during acceleration and deceleration.

Although the invention is illustrated and described with reference to a hardware embodiment it is submitted that the invention may be embodied in a programmed computer or microcomputer having adequate storage and computational facilities. Further, it is recognized that those skilled in the art may make changes to the disclosed embodiment without departing from the spirit of the invention as disclosed herein and set forth in the appended claims.

Having thus described the invention what is claimed is:

1. A method for generating a signal indicative of the phase angle ∅ of torque impulses imparted to a rotary member comprising the steps of:

sensing the rotation of the rotary member with a first sensor to generate pulse reference signals indicative of at least one predetermined angular position of the rotary member with respect to each torque impulse;

sensing the rotation of the rotary member with a second sensor between said pulse reference signals to generate period signals indicative of the rotational velocity of the rotary member during predetermined equal angular intervals during each torque impulse;

sensing the rotation of the rotary member with a third sensor, immediately following each pulse reference signal to generate two sequential speed signals indicative of the instantaneous rotational velocity of the rotary member at said at least one predetermined angular position of the rotary member;

generating a correction factor having a value proportional to the difference between said two sequentially generated speed signals;

adding and subtracting said period signals corrresponding to each torque impulse in a predetermined sequence to generate function signals A sin ∅ and A cos ∅ where A is the amplitude of the torque impulse and ∅ is the phase angle of the torque impulse with reference to the reference signal and in the direction of rotation of the rotary member;

adding said correction factor to said function signal A sin ∅ to generate a corrected function signal A sin ∅;

dividing said corrected function signal A sin ∅ and said function signal A cos ∅, one by the other, to generate an address to a look-up table storing the value of the phase angle ∅ as a function of the arctangent (A sin ∅/A cos ∅); and addressing said look-up table with said address to generate said phase angle ∅ corrected for the change in the rotational speed of the rotary member due to the torque impulse.

2. The method of claim 1 wherein said step of generating a correction factor comprises the steps of:

subtracting the speed signal generated at the beginning of the torque impulse from the speed signal generated at the beginning of the next sequential torque impulse to generate a difference signal; and multiplying said difference signal by a predetermined constant to generate said correction factor.

3. The method of claim 1 wherein said step of sensing the rotation of the rotary member to generate period signals comprises the steps of:

sensing the rotation of the rotary member to generate a predetermined number of period reference signals indicative of four equal angular rotational intervals of said rotary member between successive reference signals;

generating pulse signals with an oscillator at a frequency much higher than the frequency at which said period reference signals are generated;

counting said pulse signals in a counter during successive period reference signal to generate sequential period signals each having a value corresponding to the time it takes the rotary member to rotate through each of said four angular intervals.

4. The method of claim 3 wherein said step of adding and subtracting comprises the steps of:

generating add/subtract signals in response to said reference signal and period reference signals;

adding and subtracting said sequential period signals in a first predetermined sequence with a first add-/subtract circuit in response to said add/subtract signals to generate said function signal A sin ∅; and adding and subtracting said sequential period signals in a second predetermined sequence with a second add/subtract circuit in response to said add/subtract signals to generate said function A cos ∅.

5. The method of claim 4 wherein there are four of said sequential period signals designated $P_1$, $P_2$, $P_3$ and $P_4$ in the sequential order in which they are generated, said step of adding and subtracting to generate said function signal A sin ∅ comprises the step of adding and subtracting said sequential period signal to generate said function signal A sin ∅ having a value:

$$A \sin \emptyset = [(P_1 - P_2) + (P_3 - P_4)]$$

and said step of adding and subtracting said sequential period signals to generate said function signal A cos ∅ comprises the step of adding and subtracting said sequential period signals to generate said function signal A cos ∅ having a value:

$$A \cos \emptyset = [(P_1 - P_2) - (P_3 - P_4)].$$

6. The method of claim 5 wherein the value of the function signal A cos ∅ is smaller than the value of the corrected function signal A sin ∅, said step of dividing to generate an address includes the steps of:

comparing the value of the corrected function signal A sin ∅ with the value of the function signal A cos ∅ to generate an invert signal when the value of the function signal A cos ∅ is smaller than the value of the corrected function signal A sin ∅;

dividing the value of the corrected function signal A sin ∅ by the value of the function signal A cos ∅ to generate said address in the absence of said invert signal;

dividing the value of the function signal A cos ∅ by the value of the corrected function signal A sin ∅ in response to said invert signal to generate said address; and wherein said step of addressing a look-up table storing the values of the phase angle ∅ includes the step of:

subtracting the value of the phase angle ∅ output from the look-up table from the value of $\pi/2$ in response to said invert signal to correct the value of the phase angle ∅ output from the look-up table for dividing the value of the function signal A cos ∅ by the value of the corrected function signal A sin ∅.

7. A circuit for generating a phase angle signal indicative the phase angle of the individual torque impulses produced by the individual pistons of an internal combustion engine on the engine's crankshaft comprising:

first sensor means responsive to the rotation of the engine's crankshaft to generate reference signals $\theta_R$ indicative of the beginning of each torque impulse;

second sensor means responsive to the rotation of the engine's crankshaft and said reference signal $\theta_R$ for sequentially generating speed signals having values indicative of the rotational speed of the engine's crankshaft at the beginning of each torque impulse;

means for generating a correction factor in response to said sequentially generated speed signals having a value proportional to the difference in the rotational speed of the engine's crankshaft at the beginning of successive torque impulses;

third sensor means for generating four period reference signals $\theta_P$ in response to the rotation of the engine's crankshaft, said period reference signals $\theta_P$ dividing each torque impulse into four equal angular intervals;

means for generating four sequential period signals, $P_1$, $P_2$, $P_3$ and $P_4$ indicative of the rotational velocity of the engine's crankshaft during each of said four equal angular intervals in response to said reference signal $\theta_R$ and period reference signals $\theta_P$;

means for adding and subtracting said period signals in predetermined sequences to generate function signals A sin $\emptyset$ and A cos $\emptyset$ where $\emptyset$ is the phase angle of the torque impulse with reference to said reference signal $\theta_R$ and in the direction of rotation of the crankshaft and A is the amplitude of the torque impulse;

means for adding said correction factor to the value of said function signal A sin $\emptyset$ to generate a corrected function signal A sin $\emptyset$; and means for generating a value for the phase angle $\emptyset$ from the value of said corrected function signal A sin $\emptyset$ and the value of said function signal A cos $\emptyset$.

8. The circuit of claim 7 wherein said means for generating a correction factor comprises:

means responsive to said reference signal $\theta_R$ for subtracting the value of said speed signal at the beginning of the torque impulse from the value of said speed signal at the beginning of the next sequential torque impulse to generate a difference signal; and means for multiplying said difference signal by a predetermined constant to generate said correction factor.

9. The circuit of claim 8 wherein said second sensor means comprises:

a sensor for detecting the passing to two successive teeth on the engine's flywheel to generate increment signals $\theta_I$;

oscillator means for generating output pulses at a frequency substantially higher than the frequency at which said increment signals $\theta_I$ are generated; and counter means responive to said reference signal $\theta_R$, said period signals $\theta_P$ and said increment signals $\theta_I$ for counting the number of output pulses from said oscillator between the first two increment signals $\theta_I$ following the first period reference signal $\theta_P$ generated after each reference signal $\theta_R$ to generate said speed signal.

* * * * *